United States Patent [19]

Trent

[11] Patent Number: 4,982,387
[45] Date of Patent: Jan. 1, 1991

[54] DIGITAL TIME BASE WITH DIFFERENTIAL PERIOD DELAY

[75] Inventor: William A. Trent, Bend, Oreg.
[73] Assignee: Tektronix, Inc., Beaverton, Oreg.
[21] Appl. No.: 399,663
[22] Filed: Aug. 28, 1989
[51] Int. Cl.⁵ .............................................. G04F 8/00
[52] U.S. Cl. ...................................... 368/117; 368/120
[58] Field of Search ................................ 368/113–120

[56] References Cited

U.S. PATENT DOCUMENTS

| | | | |
|---|---|---|---|
| 4,105,932 | 8/1978 | Cleary, Jr. et al. | 368/115 |
| 4,164,648 | 8/1978 | Chu | 368/118 |
| 4,383,166 | 8/1978 | Chu et al. | 368/119 |
| 4,633,421 | 12/1986 | Watson, Jr. et al. | 368/47 |

Primary Examiner—Bernard Roskoski
Attorney, Agent, or Firm—Franics I. Gray; William K. Bucher

[57] ABSTRACT

A digital time base with differential period delay uses the difference in period between a master oscillator and a voltage controlled oscillator phase-locked to the master oscillator to achieve small time delay increments. The oscillators are used to drive respective delay generator trigger channels that have programmable counters and state machines. A first programmable counter is a clock counter to generate a lock signal to initiate a delay sequence, the lock signals from the respective channels being input to a phase detector to generate an error signal to keep the VCO phase-locked with the master oscillator. A second programmable counter is a delay counter that is controlled by a delay state machine to generate a delay signal. The delay signal is input to respective trigger state machines to generate the desired trigger signals, the duration of the trigger signals being a function of a third programmable counter. By programming the proper values for each counter, the amount of delay for each trigger signal may be controlled with respect to the other.

12 Claims, 7 Drawing Sheets

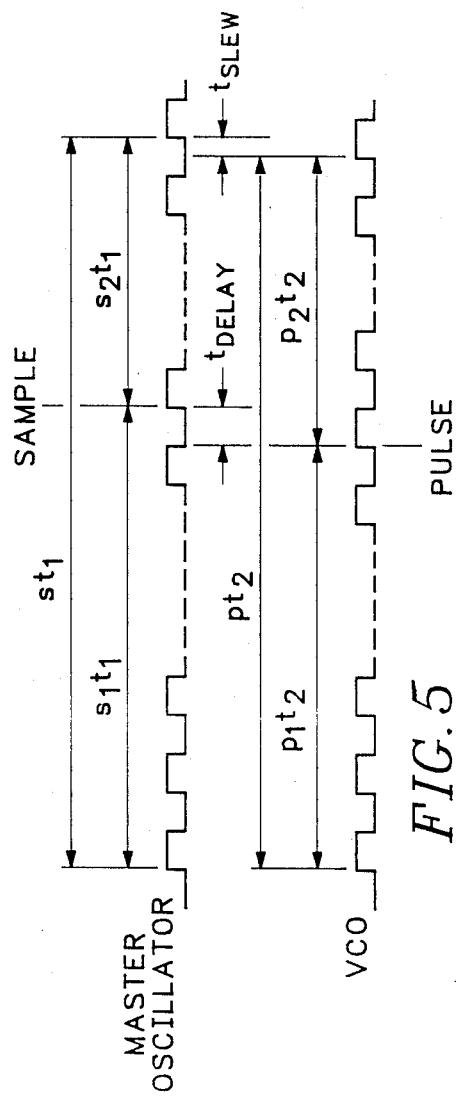
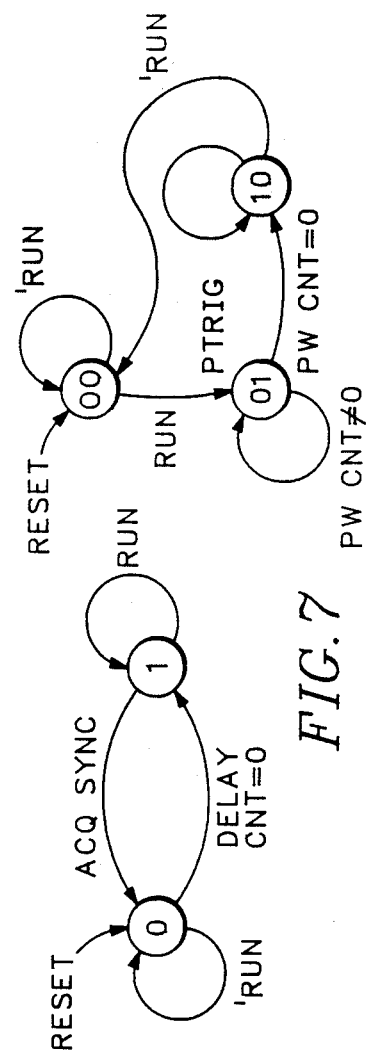
FIG. 5
FIG. 7

DIGITAL TIME BASE WITH DIFFERENTIAL PERIOD DELAY

BACKGROUND OF THE INVENTION

The present invention relates to timing circuits, and more particularly to a digital time base circuit for a time domain reflectometer that uses the difference in period between two phase-locked oscillators to achieve small time delay increments.

The purpose of a time base circuit is to provide timing signals needed to control various aspects of an instrument, such as excitation and data acquisition systems for a time domain reflectometer. The timing signals for the time domain reflectometer provide a clock signal to drive a mask generator that is phase-locked to an excitation pulse, and a clock signal that is phase-locked to a sample trigger used to control the acquisition and processing of multiple samples for each excitation pulse. It is necessary to provide small time delay increments to delay the excitation pulse relative to the samples. This has been achieved by using either analog or a combination of digital and analog techniques.

One such example of a prior art time base circuit is disclosed in the OF235 Fiber Optic Time Domain Reflectometer manufactured by Tektronix, Inc. of Beaverton, Oreg. A master clock is divided to provide the necessary clock signals for the time base circuit. An analog ramp signal is generated from an excitation pulse trigger and compared with a reference level derived from a digital value provided by a processor to generate a sample trigger. U.S. Pat. No. 4,841,497 issued on June 20, 1989 to Glenn Bateman and Donald L. Brand entitled "Digital Time Base with Corrected Analog Interpolation" also describes such a time base circuit, specifically indicating how the generated ramp signal may be calibrated to provide more precise delay times.

However these traditional methods cannot be used where there is a requirement for providing clock signals for use in other parts of the measurement system. Therefore what is desired is a digital time base system for providing small delay increments while providing clock signals to other parts of a measurement system.

SUMMARY OF THE INVENTION

Accordingly the present invention provides a digital time base that uses the difference in period between two phase-locked oscillators to achieve small time delay increments. A reference clock is input to a first trigger generator to produce a sample trigger signal and a first phase reference signal. The first phase reference signal is input to a phase detector, the output of which is used to control a voltage controlled oscillator. The voltage controlled oscillator provides a phase-locked clock that is input to a second timing pulse generator to produce a pulse trigger and a second phase reference signal. The second phase reference signal also is input to the phase detector for comparison with the first phase reference signal to generate the control voltage for the voltage controlled oscillator. The output of the voltage controlled oscillator may be used for timing other portions of the instrument. A programmable delay generator in each timing pulse generator provides a suitable delay for each trigger, the delay being variable in increments of 1/dt where dt is the difference in period between the two oscillators.

The objects, advantages and other novel features of the present invention are apparent from the following detailed description when read in conjunction with the appended claims and attached drawing.

BRIEF DESCRIPTION OF THE DRAWING

FIG. 5 is a timing diagram illustrating the operation of the digital time base generator of the present invention.

FIG. 7 is a state diagram for a pulse timing state machine within the delay generator of FIG. 3 according to the present invention.

DESCRIPTION OF THE PREFERRED EMBODIMENT

Figure 1:
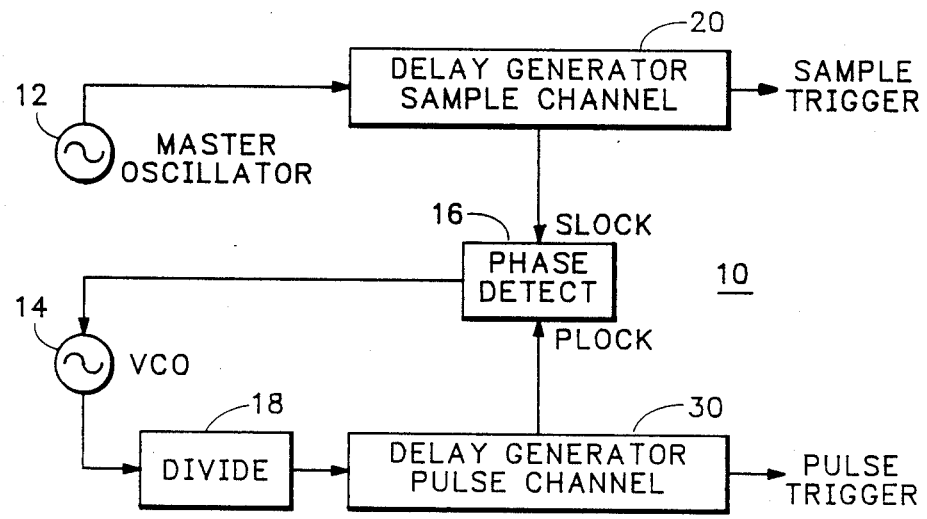
FIG. 1 is a block diagram of a digital time base generator according to the present invention.

Referring now to FIG. 1 a digital time base generator 10 has two nearly identical channels, a sample channel 20 and a pulse channel 30, that each have programmable counters and control logic. The sample channel 20 is driven by a master oscillator 12, such as a temperature compensated, crystal oscillator that is very stable. The pulse channel 30 is driven by a voltage controlled oscillator 14 that is phase-locked to the master oscillator 12. One of the counters in each channel, as is described in more detail below, is used in a phase-lock clock generator to set the difference in clock period between the VCO period and the master oscillator period to some fraction of the master oscillator period. A second set of counters in each channel, again as is described in more detail below, is used as a programmable delay generator that performs two functions: (a) to control the start of an acquisition, or sampling, interval and the generation of an excitation pulse; and (b) to control the time between acquisition intervals and the time between pulses. By setting the proper values into the delay counters, an acquisition window may be made to "slew" across the pulse in steps that are a multiple of the clock period difference.

Figure 2:
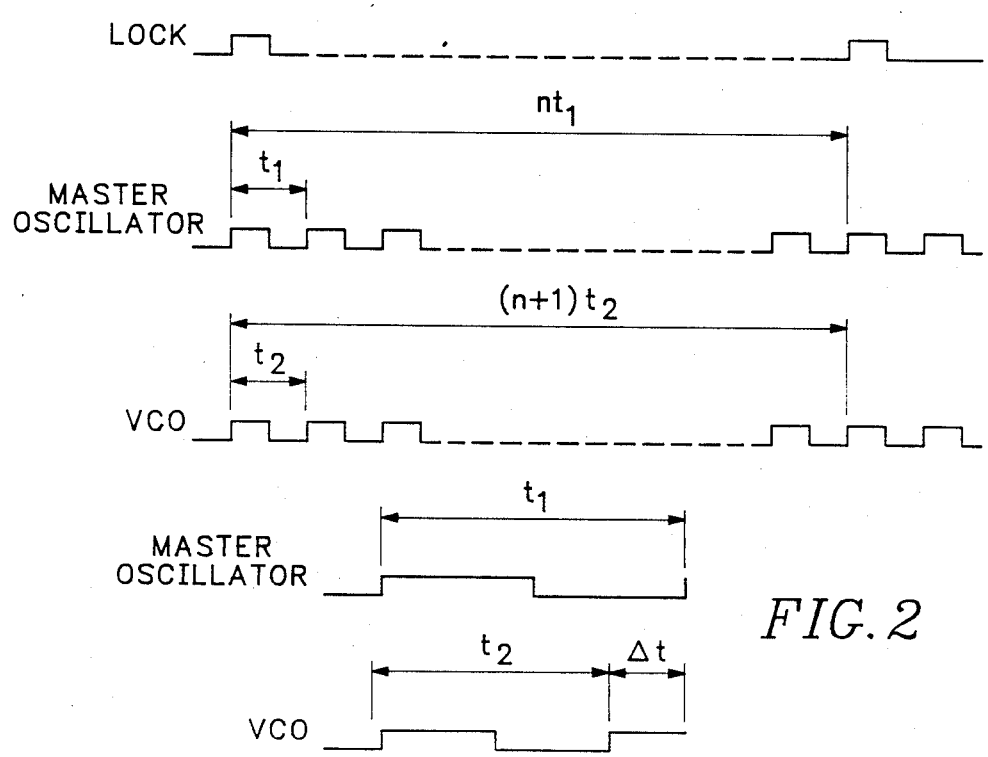
FIG. 2 is a timing diagram illustrating the relative timing between the master oscillator and the voltage controlled, phase locked oscillator for the digital time base generator of the present invention.

The basic clock relations between the master oscillator 12 and the VCO 14 are illustrated in FIG. 2. The relative periods of the two oscillators are set by a predetermined minimum sample time increment such that:

$$dt = t_1 - t_2$$

where $t_1$ is the period of the master oscillator 12 and $t_2$ is the period of the VCO 14. By setting:

$$t_2 = (n/(n+1))t_1$$

then:

$$dt = (1/(n+1)) t_1$$

The frequency of the oscillators is determined by the maximum pulse repetition rate and the minimum sample time increment, $$df = f_1/n$$

and $$f_1 = 1/((n+1)dt)$$

respectively.

Figure 3:
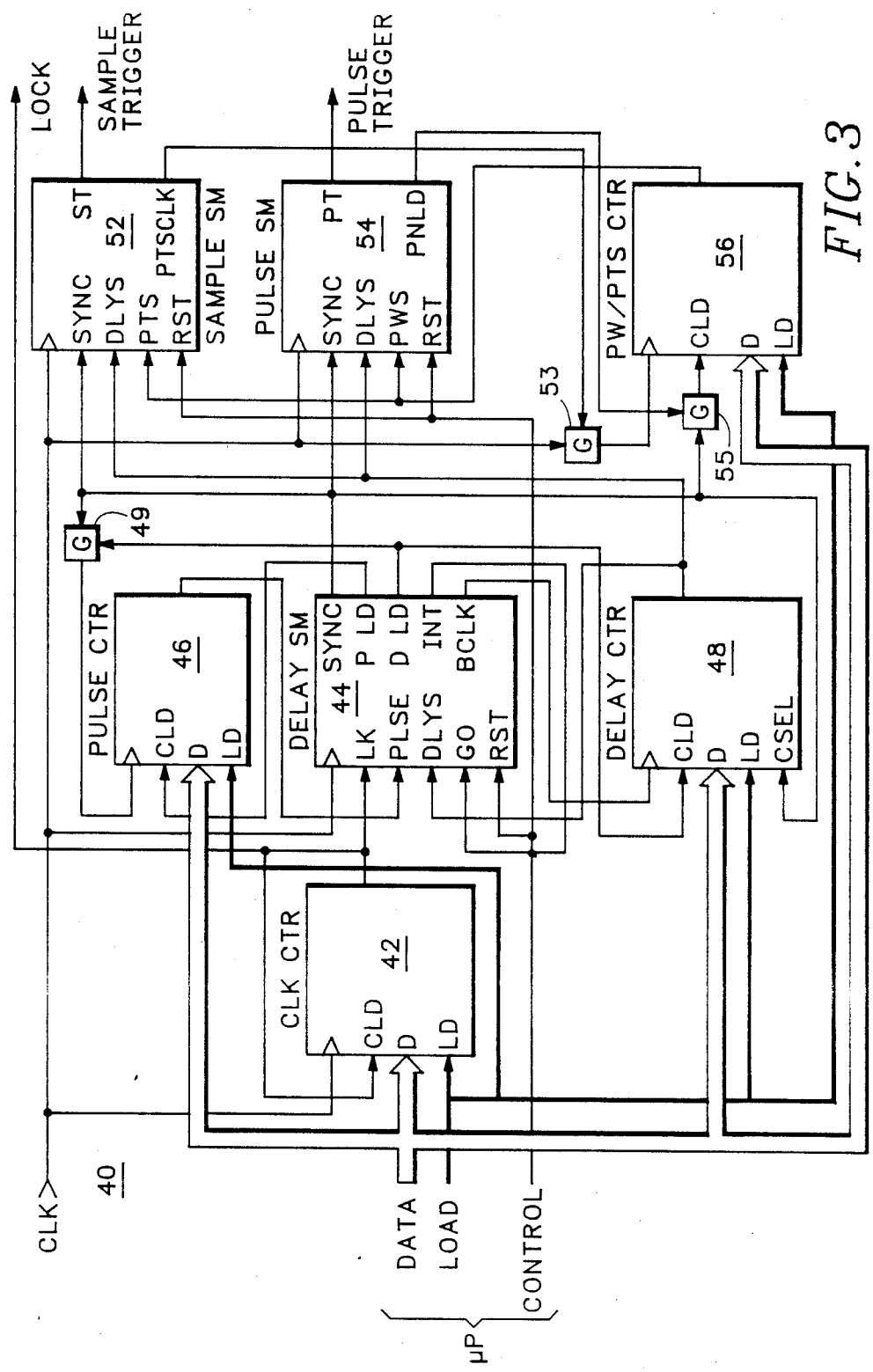
FIG. 3 is a block diagram of a delay generator for the digital time base generator of the present invention.

FIG. 3 shows a generic delay generator 40 that may be used either for the sample channel 20 or the pulse channel 30. The clock input to the delay generator 40 is either SCLK from the master oscillator 12 or PCLK from the VCO 14, depending in which channel the delay generator is. The delay generator 40 is composed of programmable register/counters and state machines. The CLK signal is input to a clock counter 42 that is preloaded by a microprocessor (not shown) with the value of n or (n+1) as required by the particular channel. The clock counter 42 counts down until a zero count is reached, at which time a LOCK pulse is output. The LOCK pulse is either SLOCK for the sample channel 20 or PLOCK for the pulse channel 30. The LOCK pulse also causes the clock counter to be reloaded with the count stored from the microprocessor.

The LOCK pulse is input to a delay state machine 44 that is driven by the CLK pulse. The delay state machine 44 has inputs from a pulse counter 46 and a delay counter 48, as well as control signals from the microprocessor. The outputs of the delay state machine 44 include a SYNC signal indicating the start of an acquisition interval, a Pulse LoaD signal to reload the pulse counter 46, a Delay LoaD signal to reload the delay counter 48, and a Buffer CLocK to clock the delay counter for each clock pulse from a predetermined start time. The pulse counter 46 is preloaded by the microprocessor with a count representing the number of pulse intervals in an acquisition cycle, and the delay counter is preloaded by the microprocessor with a count 48 representing a desired delay interval within the acquisition interval. The SYNC and Delay LoaD outputs of the delay state machine 44 are input to a pulse gate 49 so that for every excitation pulse generated the pulse counter 46 is decremented by one until the count reaches zero, indicating the end of an acquisition cycle. The end of an acquisition cycle results in the generation of an INTerrupt signal by the delay state machine 44 that signals the microprocessor that the acquisition cycle is complete.

The delay counter 48 is preloaded with two delay values: $d_1$ indicating the delay time from the start of an interval; and $d_2$ indicating the delay time from the end of $d_1$ to the end of the interval. The delay count loaded into the delay counter 48 is determined by the status of the SYNC pulse, i.e., $d_1$ is loaded when SYNC is asserted at the beginning of an interval, and $d_2$ is loaded when SYNC is not asserted in the middle of an interval. The delay counter 48 counts down using the Buffer CLocK signal from the delay state machine 44, and the delay state machine provides a Delay LoaD output when the delay count is zero.

The DeLaY Signal from the delay counter 48 and the SYNC signal from the delay state machine 44 are input to the next stage which is the trigger generation stage. Either a sample state machine 52 or a pulse state machine 54 is active, again depending in which channel the delay generator 40 is. These state machines share a common counter 56 that acts either as a sample points counter or a pulse width counter according to the state machine with which it is used. Again both state machines 52, 54 by the CLK signal and have the SYNC signal an the DeLaY Signal from the previous delay generation stage as inputs, as well as the zero count output of the common counter 56. The sample state machine 52 provides the sample trigger output and a PoinTS CLocK output that clocks the common counter 56 as a sample points counter via clock gate 53. The common counter 56, as a sample points counter, is loaded with a preloaded count, representing the number of samples to be taken during the acquisition interval, by the SYNC signal via a load gate 55. The DeLaY Signal initiates the sample trigger from the sample state machine 52, and the points count output returns the sample state machine to an idle state.

Likewise the common counter 56, as a pulse width counter, is loaded via gate 55 by a Pulse Width LoaD signal from the pulse state machine 54 with a preloaded count representing the width of the excitation pulse in CLK cycles. Gate 53 passes the CLK signal to the common counter 56 to count down the pulse width. The pulse state machine 54 initiates the pulse trigger, after receiving the SYNC signal, upon the receipt of the DeLaY Signal, and terminates the pulse trigger upon the receipt of the pulse width signal from the common counter 56.

Figure 4:
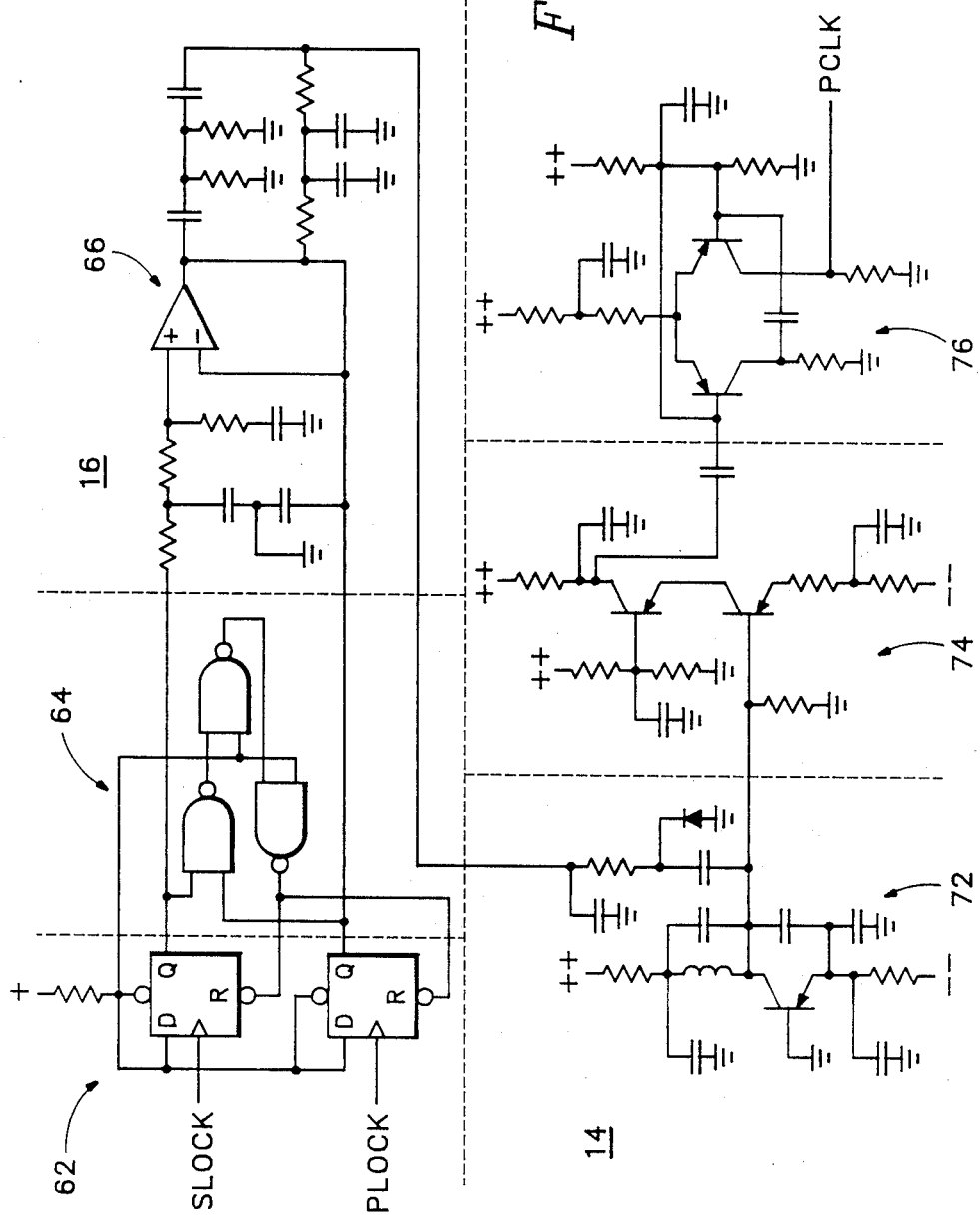
FIG. 4 is a schematic diagram of a phase detector and voltage controlled oscillator for the digital time base generator of the present invention.

The phase detector 16 and VCO 14 are shown in greater detail in FIG. 4. The phase detector 16 has an input flip-flop stage 62 to which the SLOCK and PLOCK from the respective channels are input. The outputs of the flip-flop stage 62 are input to a gate stage 64 and an error amplifier stage 66. The gate stage 64 resets the flip-flop stage 62 when both the SLOCK and PLOCK signals have occurred. If the outputs of the flip-flop stage go high simultaneously indicating that the two oscillators 12, 14 are in phase, the differential input to the error amplifier 66 is zero and no voltage change is made at the input to the VCO 14. However if one of the LOCK signals precedes the other, then the outputs of the flip-flop stage are different during the interval between LOCK signals, providing a differential voltage input to the error amplifier 66. Depending upon which LOCK signal is early, the error amplifier 66 either increases or decreases the voltage applied to the VCO 14, changing the output frequency accordingly. The longer the time difference between SLOCK and PLOCK, the greater the error voltage. The maximum error voltage occurs at a time differential where the RC circuits of the error amplifier 66 charge fully.

The VCO 14 has an LC oscillator stage 72 that free runs at a nominal frequency that provides the desired frequency for the pulse channel 30. The error voltage from the phase detector 16 is applied to the LC oscillator stage 72 to maintain the oscillator phase-locked with the master oscillator 12. A buffer amplifier stage 74 and a differential logic level translation stage 76 convert the VCO frequency to a clock output for application to the pulse channel 30 and to other measurement portions of the measurement instrument that require synchronization with the excitation pulse.

The two delay counters 48 for the respective channels are driven by the master oscillator 12 having a period of $t_1$ and by the VCO 14 having a period of $t_2$. If the two delay counters 48 are programmed to delay by s and p clock cycles respectively, the time difference between the output of the delay counters at the end of a delay cycle is:

$$t_{slew} = st_1 - pt_2$$

Substituting the value for $t_2$ above and setting $p = s+1$ produces, as shown in FIG. 5:

$$t_{slew} = ((s-n)/(n+1))t_1$$

Given some constant k, if $s = n+k$, then the sample and pulse are displaced for each pulse interval by:

$$t_{slew} = (((n+k)-n)/(n+1))t_1 = (k/(n+1))t_1 = kdt$$

The pulse and sample triggers always occur at the same time relative to each other when s is an integer multiple, c, of n and p is the same integer multiple of $n+1$. In general the total delay counts that are set for any given sample spacing are:

$$s = cn + m + j$$

$$p = c(n+1) + j$$

$$m = int(k/(n+1))$$

$$j = mod(k/(n+1))$$

where "int" is the integer part of the results of the operation and "mod" is the integer part of the remainder of the operation.

To provide a mechanism for allowing some absolute time delay between the pulse and the start of the sample interval, these total delay counts are split into components: $s_1$, $s_2$ and $p_1$, $p_2$. If the delay counters 48 are programmed to delay by $s_1$ and $p_1$ clock cycles, the time difference between the outputs of the delay counters at the end of a delay cycle is:

$$t_{delay} = s_1 t_1 - p_1 t_2$$

or substituting for $t_2$:

$$t_{delay} = (s_1 - p_1)t_1 + p_1 dt$$

The first term of $t_{delay}$ is the "coarse" delay between the pulse and the sample interval, and the second term is the "fine" delay. This results in the solution:

$$s_1 - p_1 = int(t_{delay}/t_1)$$

$$p_1 = int(mod(t_{delay}/t_1)/dt)$$

$$s_2 = s - s_1$$

$$p_2 = p - p_1$$

If $t_{delay}$ is negative, then $p_1$ is negative; and $n+1$ is "borrowed" from $s_1 - p_1$, added to $p_1$ and one is subtracted from $s_1 - p_1$.

Figure 6:
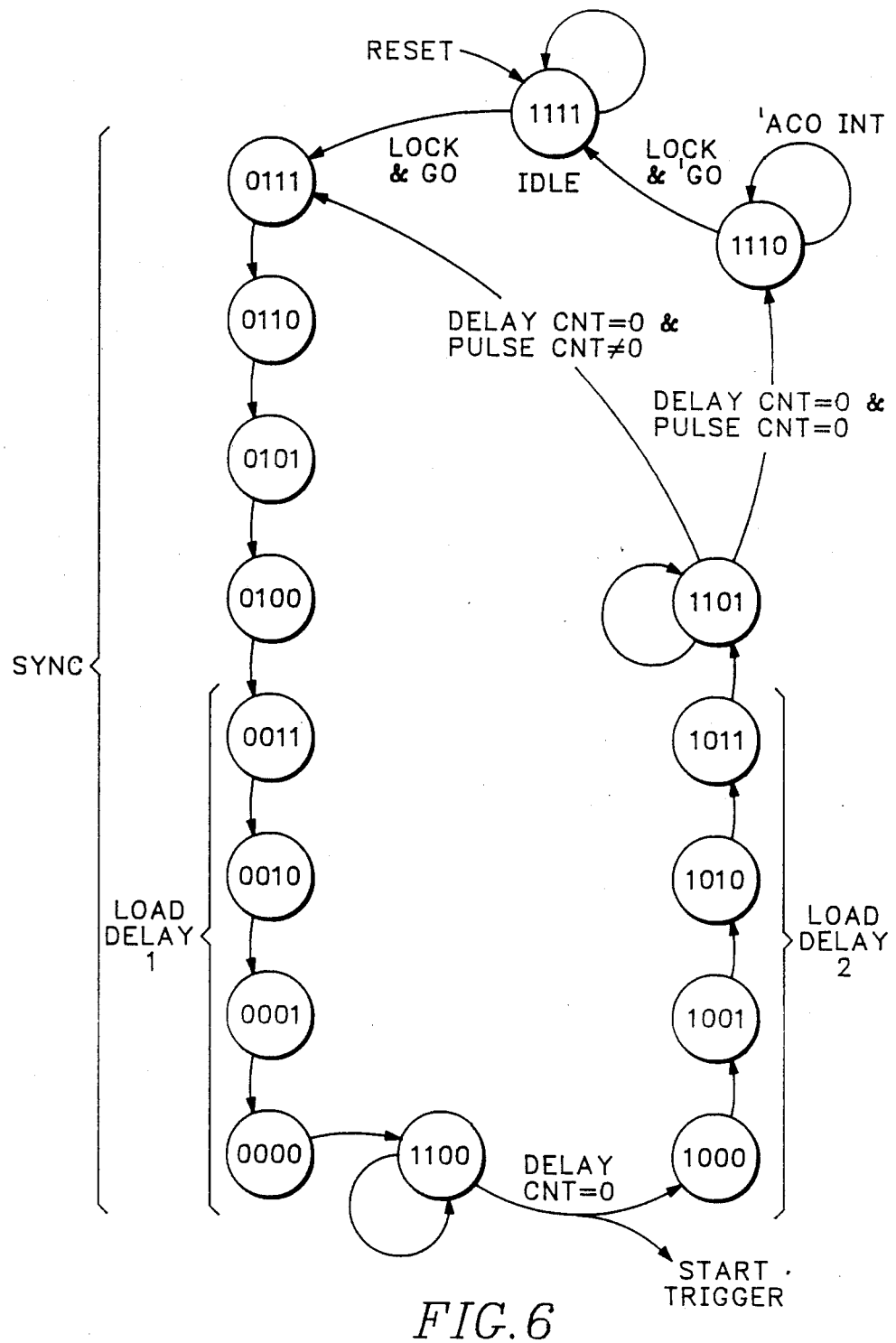
FIG. 6 is a state diagram for a sample timing state machine within the delay generator of FIG. 3 according to the present invention.

As shown in FIG. 6 the delay state machine 44 is reset to an "idle" state at power up. The delay state machine remains in the idle state until a GO control signal is received from the microprocessor and phase coherence, i.e., LOCK, of the two oscillators occurs. At this time SYNC is asserted and the sample interval begins. SYNC is asserted for eight clock cycles. During SYNC the first register is selected for the first delay count, and the sample and pulse state machines 52, 54 are held in a reset state. Four clock cycles after SYNC begins, the delay counter 48 is loaded with the first delay count. The counter load input for the delay counter 48 is released four cycles later, concurrent with SYNC, and the delay counter starts counting on the next rising edge of the clock. The termination of SYNC is used to clock the pulse counter 46. The pulse counter 46 is preset with the number of sample intervals that are to occur during an acquisition cycle, and is loaded into the pulse counter during the idle state.

When the contents of the delay counter 48 reach zero, two events occur: a second delay register within the delay counter is selected and its contents are loaded into the delay counter. This second load cycle also lasts for four clock cycles. After the delay counter 48 is reloaded with the second delay value, the second delay interval begins. During the first portion of the sample interval the sample and pulse state machines 52, 54 wait for the delay count to reach zero, whereupon on the next clock they begin to operate.

After the second delay is completed the contents of the pulse counter 46 are tested for a zero value. If the zero value is not present, the cycle repeats and SYNC is generated again. If the pulse counter 46 has reached zero, the acquisition is complete and an INTerrupt for the microprocessor is asserted. The INTerrupt remains active until acknowledged by the microprocessor. Then the delay state machine 44 returns to the idle state until LOCK occurs.

The pulse state machine 54 generates the pulse triggers to drive an excitation device, and has two state machines, as shown in FIG. 7. A small two-state machine synchronizes the zero output of the delay counter 48 with the clock. This machine is reset to idle by SYNC and remains in that state until the delay counter 48 goes to zero. When the delay count is zero, the machine toggles to a "run" state and releases the second state machine to start on the next clock. The acquisition loop of the second machine has three states. SYNC resets this machine to the first state where it is held until the $p_1$ count is zero. In the first state the load control line for the pulse width counter 56 and the pulse trigger output signal are held in an "idle" state. In state two the pulse trigger is asserted and the pulse width counter 56 is allowed to decrement. When the pulse width count reaches zero, the machine enters state three on the next clock. State three is the terminal state and all signals are returned to their idle, state one, levels. The machine remains in state three until SYNC resets it to state one.

Figure 8:
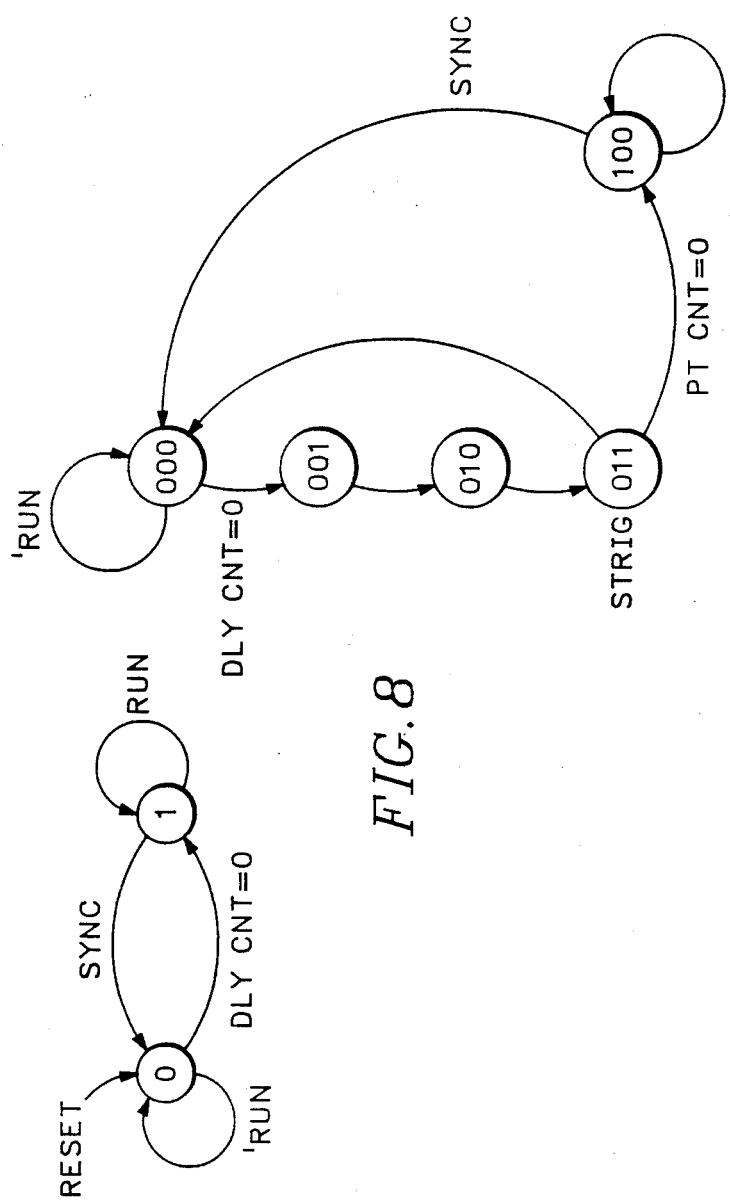
FIG. 8 is a state diagram for a delay state machine within the delay generator of FIG. 3 according to the present invention.
Figure 9:
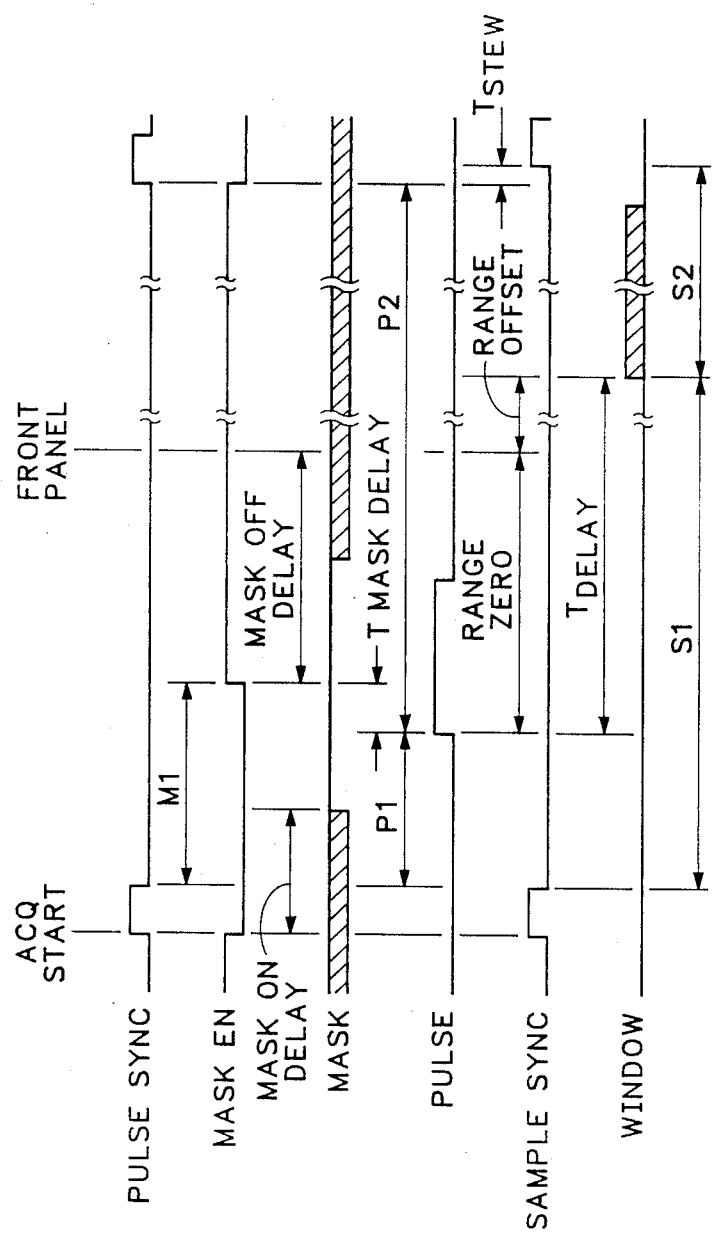
FIG. 9 is another timing diagram illustrating the operation of the digital time base generator of the present invention in an optical time domain reflectometer.

The sample state machine, as shown in FIG. 8, also has two state machines. A small two-state machine synchronizes the zero output of the delay counter 48 with the clock. This machine is reset to idle by SYNC and remains in that state until the delay count goes to zero. At zero delay count this machine toggles to the "run" state and releases the second state machine to start on the next clock. Although the sample state machine 52 stores acquisition data in response to the sample trigger and transfers data for processing by the microprocessor, only the functions required to generate the sample trigger are discussed here. The normal acquisition loop of this second state machine has five states. SYNC resets this machine to a first state where it is held until the $s_1$ count is zero. In this first state all signal lines are held in an "idle" state. The transition to state two decrements and tests the output of the sample points counter 56. When the count is zero, the desired number of samples have been taken and the data acquisition for the current pulse is ended. In state two a "sample zero" is asserted for the zero interval and returned to idle at state three. The sample trigger is asserted at state four for the duration of that state, and the output of the sample points counter 56 is tested for zero. If the sample points count is zero, the machine enters state five on the next clock pulse, terminating the acquisition loop and returning all signals to state one levels. The machine is returned to state one when reset by SYNC. If the sample points count is not zero, the machine continues to state one on the next clock, decrementing the sample points count.

Where masking also is desired, the VCO 14 may be used to drive a mask channel having a delay counter in the same manner as in the pulse channel. FIG. 9 illustrates a complete acquisition interval where the pulse channel SYNC and sample channel SYNC signals initially start simultaneously. A mask enable signal is initiated at the same time as the pulse SYNC and delayed by a time $m_1$. The excitation pulse is delayed from the pulse SYNC signal by a duration $p_1$, and the next pulse SYNC occurs at a duration $p_2$ after start of the pulse. The sample triggers are delayed by a duration $s_1$ from the sample SYNC signal, and occur during the sample window defined by the number of desired sample points and the spacing between points. At the completion of duration $s_2$ from the start of the sample window the next sample SYNC occurs. At this point there is a difference $t_{slew}$ between the pulse and sample SYNCs so that for the next pulse interval the samples are offset from the first set of samples increasing the sample density.

Figure 10:
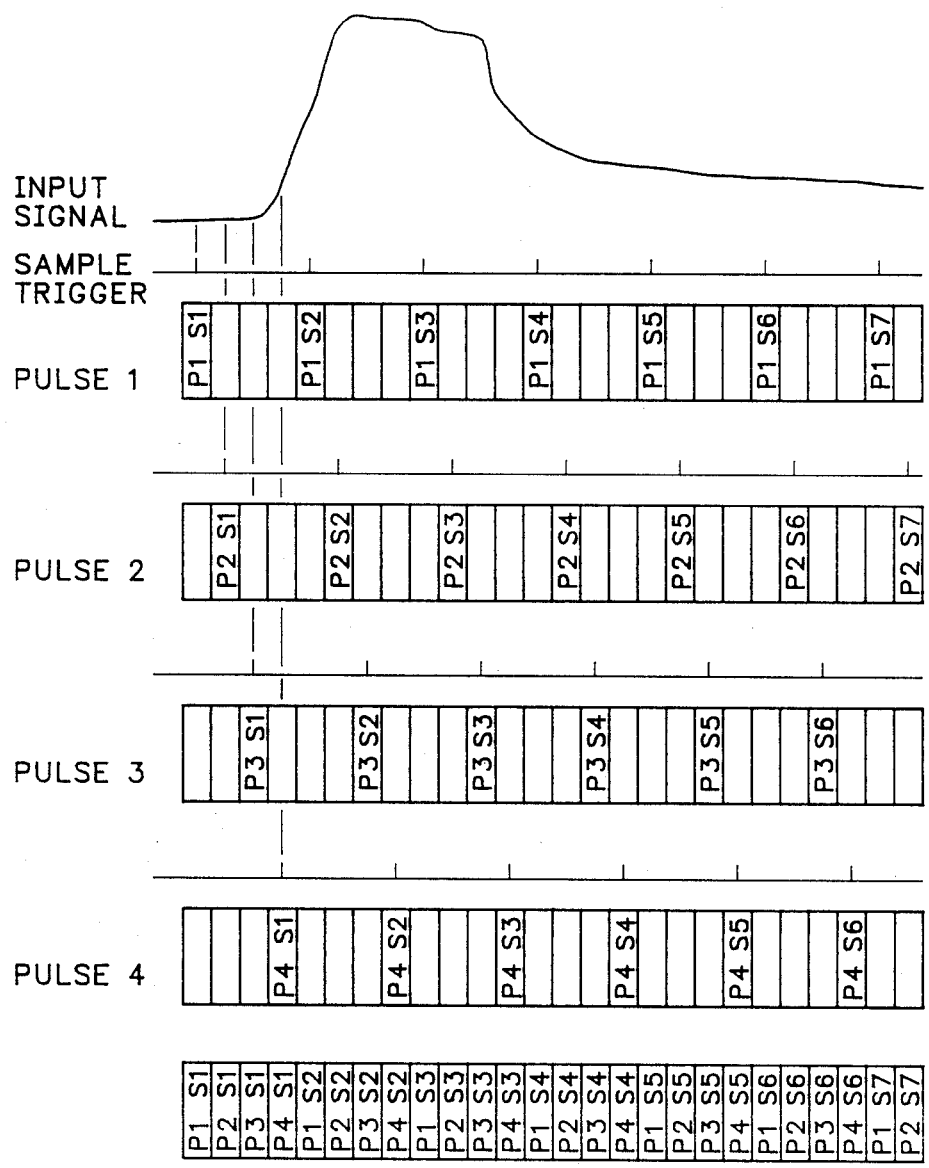
FIG. 10 is a timing diagram illustrating the interleaving of sample data using the digital time base generator of the present invention.

The actual storage into an acquisition memory may be interleaved as shown in FIG. 10 to obtain such higher sample density. Thus for the first pulse the data is sampled and stored into every fourth memory location. For the second pulse the sample triggers are slewed by one-quarter of a sample interval and the data is stored in the next locations at every fourth memory location. Likewise for the third and fourth pulses until a complete set of samples at a higher sampling density is accumulated.

Thus the present invention provides a digital time base with differential period delay between two phase-locked oscillators. The difference in period between the oscillators is used to delay in small time delay increments an excitation pulse relative to samples in a time domain reflectometer system using programmable counters and state machines to digitally determine the delays and generate the necessary triggers.

What is claimed is:
1. A digital time base comprising:
   a reference oscillator operating at a reference frequency;
   an excitation oscillator phase-locked to the reference oscillator operating at a nominal frequency;
   means for generating a first trigger delayed a first programmable period of time from a first marker derived from the reference oscillator; and
   means for generating a second trigger delayed a second programmable period of time from a second marker derived from the excitation oscillator, the difference in time between the first and second triggers being a function of a time delay increment that is the difference in period between the reference and nominal frequencies.

2. A digital time base as recited in claim 1 wherein the excitation oscillator comprises:
   a phase detector having the first and second markers as inputs to generate an error signal representative of a time difference between the first and second markers; and
   a programmable oscillator having an excitation frequency that is a function of the error signal and the nominal frequency.

3. A digital time base as recited in claim 2 wherein the first trigger generating means comprises programmable means for counting cycles of the reference frequency to generate the first marker every n cycles, n being an integer.

4. A digital time base as recited in claim 3 wherein the first trigger generating means further comprises:
   means for generating a delay signal as a function of a programmable delay interval after the first marker; and
   means for initiating the first trigger as a function of the delay signal.

5. A digital time base as recited in claim 4 wherein the delay signal generating means further comprises:
   means for counting the programmable delay interval to output the delay signal; and
   means for controlling the counting means, the controlling means providing a delay clock signal to the counting means to count the programmable delay interval and a delay load signal to reload the delay counter with the programmable delay interval after the delay signal is output.

6. A digital time base as recited in claim 5 wherein the initiating means comprises:
   sample point means for counting a programmable sample point number representing the number of data samples to be obtained per first trigger duration; and
   means for controlling the sample point means, the sample point controlling means outputting the first trigger in response to the delay signal and a points clock signal for input to the sample point means to count the programmable sample point number, the duration of the first trigger being a function of the programmable sample point number.

7. A digital time base as recited in claim 4 wherein the first trigger generating means further comprises means for determining when a predetermined number of second triggers have been generated, indicating the end of a trigger generation cycle.

8. A digital time base as recited in claim 3 wherein the second trigger generating means comprises programmable means for counting cycles of the excitation frequency to generate the second marker every n+1 cycles.

9. A digital time base as recited in claim 3 wherein the second trigger generating means further comprises:
   means for generating a delay signal as a function of a programmable delay interval after the second marker; and
   means for initiating the second trigger as a function of the delay signal.

10. A digital time base as recited in claim 9 wherein the delay signal generating means further comprises:
    means for counting the programmable delay interval to output the delay signal; and means for controlling the counting means, the controlling means providing a delay clock signal to the counting, means to count the programmable delay interval and a delay load signal to reload the delay counter with the programmable delay interval after the delay signal is output.

11. A digital time base as recited in claim 10 wherein the initiating means comprises:
   pulse width means for counting a programmable pulse width number representing the pulse width of the second trigger duration; and
   means for controlling the pulse width means, the pulse width controlling means outputting the second trigger in response to the delay signal and a pulse width clock signal for input to the pulse width means to count the programmable pulse width number, the duration of the second trigger being a function of the programmable pulse width number.

12. A digital time base as recited in claim 9 wherein the second trigger generating means further comprises means for determining when a predetermined number of second triggers have been generated, indicating the end of a trigger generation cycle.

* * * * *